(12) United States Patent
Ko et al.

(10) Patent No.: US 10,720,608 B2
(45) Date of Patent: Jul. 21, 2020

(54) LIGHTING DEVICE

(71) Applicant: LG Display Co., Ltd., Seoul (KR)

(72) Inventors: Sungwook Ko, Seoul (KR); Chiwan Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/218,209

(22) Filed: Dec. 12, 2018

(65) Prior Publication Data

US 2019/0198820 A1    Jun. 27, 2019

(30) Foreign Application Priority Data

Dec. 27, 2017   (KR) .................. 10-2017-0181532

(51) Int. Cl.
| | |
|---|---|
| *H01L 51/00* | (2006.01) |
| *H01L 51/52* | (2006.01) |
| *G02F 1/01* | (2006.01) |
| *G02F 1/19* | (2019.01) |

(52) U.S. Cl.
CPC ........ *H01L 51/5296* (2013.01); *G02F 1/0105* (2013.01); *G02F 1/19* (2013.01); *H01L 51/5203* (2013.01); *H01L 51/529* (2013.01); *H01L 2251/50* (2013.01)

(58) Field of Classification Search
None
See application file for complete search history.

(56) References Cited

FOREIGN PATENT DOCUMENTS

| | | |
|---|---|---|
| KR | 10-2013-0113149 A | 10/2013 |
| KR | 10-2016-0140582 A | 12/2016 |

*Primary Examiner* — Reema Patel
(74) *Attorney, Agent, or Firm* — Seed IP Law Group LLP

(57) ABSTRACT

A lighting device includes a substrate including a display area and a non-display area and an organic light emitting layer disposed in the display area. A first electrode is disposed on the organic light emitting layer and a second electrode is disposed below the organic light emitting layer. A phase change material layer is disposed below the second electrode and a plurality of third electrodes is disposed between the substrate and the phase change material layer. Therefore, a pattern having various colors of light and various shapes may be implemented based on a shape of the plurality of third electrodes, a phase change of the phase change material layer, and a color of light emitted from the organic light emitting layer.

20 Claims, 10 Drawing Sheets

LIGHTING DEVICE

CROSS-REFERENCE TO RELATED APPLICATIONS

This application claims the priority of Korean Patent Application No. 10-2017-0181532 filed on Dec. 27, 2017, in the Korean Intellectual Property Office, the disclosure of which is incorporated herein by reference.

BACKGROUND

Technical Field

The present disclosure relates to a lighting device, and more particularly, to a lighting device which is capable of implementing various patterns with various colors.

Description of the Related Art

An organic light emitting diode is a self-emitting device in which electrons and holes from a cathode for injecting electrons and an anode for injecting holes are injected into a light emitting layer and excitons formed by coupling the injected electrons and holes are dropped from an excited state to a ground state to emit light.

The organic light emitting diode is driven at a low voltage so that it is advantageous in terms of power consumption. Further, the organic light emitting diode has excellent response speed, color reproduction, viewing angle, and contrast ratio. Further, the organic light emitting diode is strong against external impact and has a simple manufacturing process.

Therefore, a lighting device which uses the organic light emitting diode as a light source has been proposed. The lighting device using an organic light emitting diode is thin, light, and flexible to be modifiable. However, in a lighting device using an organic light emitting diode, the organic light emitting diode performs surface emission from a front surface of the lighting device so that only one color illumination may be implemented.

BRIEF SUMMARY

An embodiment of the present disclosure provides a lighting device which may implement various patterns with various colors.

Further, embodiment of the present disclosure provides a lighting device which may change colors of the lighting device using a phase change material.

Further, still another embodiment of the present disclosure provides a lighting device which may implement patterns with various colors at low power consumption.

Embodiments of the present disclosure are not limited to the above-mentioned embodiments, and other embodiments, which are not mentioned above, will be clearly understood by those skilled in the art from the following description.

According to an embodiment of the present disclosure, a lighting device includes: a substrate including a display area and a non-display area, an organic light emitting layer disposed in the display area, a first electrode disposed on the organic light emitting layer and a second electrode disposed below the organic light emitting layer, a phase change material layer disposed below the second electrode, and a plurality of third electrodes disposed between the substrate and the phase change material layer. Therefore, a pattern having various colors and various shapes may be implemented based on a shape of the plurality of third electrodes, phase change of the phase change material layer, and a color of light emitted from the organic light emitting layer.

According to another embodiment of the present disclosure, a lighting device includes: a substrate including a display area and a non-display area, a plurality of third electrodes disposed on the substrate, a plurality of phase change material layers which is disposed on the plurality of third electrodes and is spaced apart from each other, a second electrode disposed on the plurality of phase change material layers, an organic light emitting layer disposed on the second electrode, and a first electrode disposed on the organic light emitting layer. Therefore, the second electrode is shared by the plurality of phase change material layers and the organic light emitting layer to minimize the number of electrodes and a thickness of the lighting device.

Other detailed matters of the exemplary embodiments are included in the detailed description and the drawings.

According to embodiments of the present disclosure, patterns having various shapes and colors may be implemented in the lighting device.

According to embodiments of the present disclosure, colors of a lighting device or colors of patterns implemented in the lighting device may be modified.

According to embodiments of the present disclosure, an electrode is shared by a phase change material layer used to implement a pattern and an organic light emitting diode to minimize the number of electrodes and a thickness of the lighting device.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
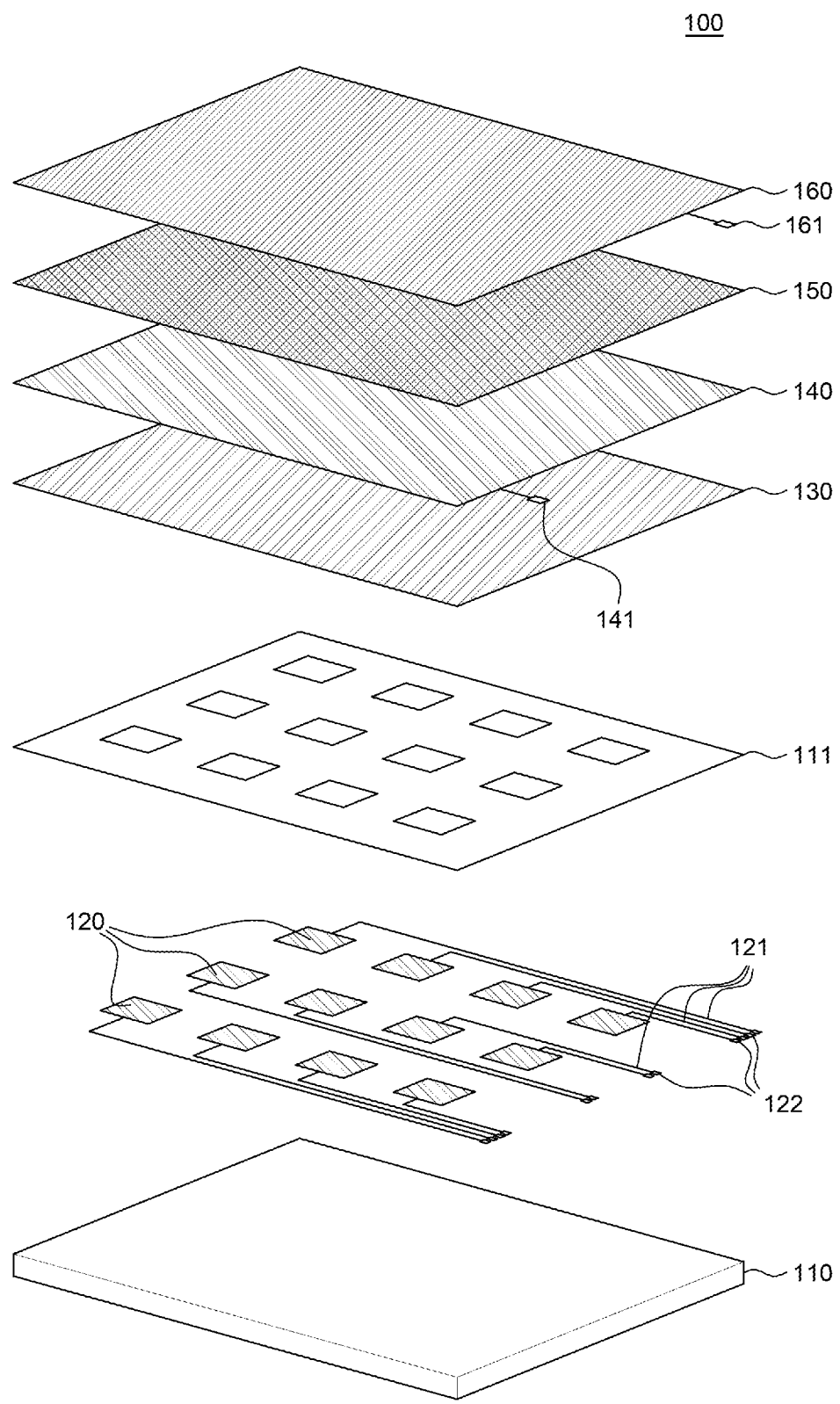
FIG. 1 is an exploded perspective view of a lighting device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but may be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a lighting device according to exemplary embodiments of the present disclosure will be described in detail with reference to accompanying drawings.

Figure 2:
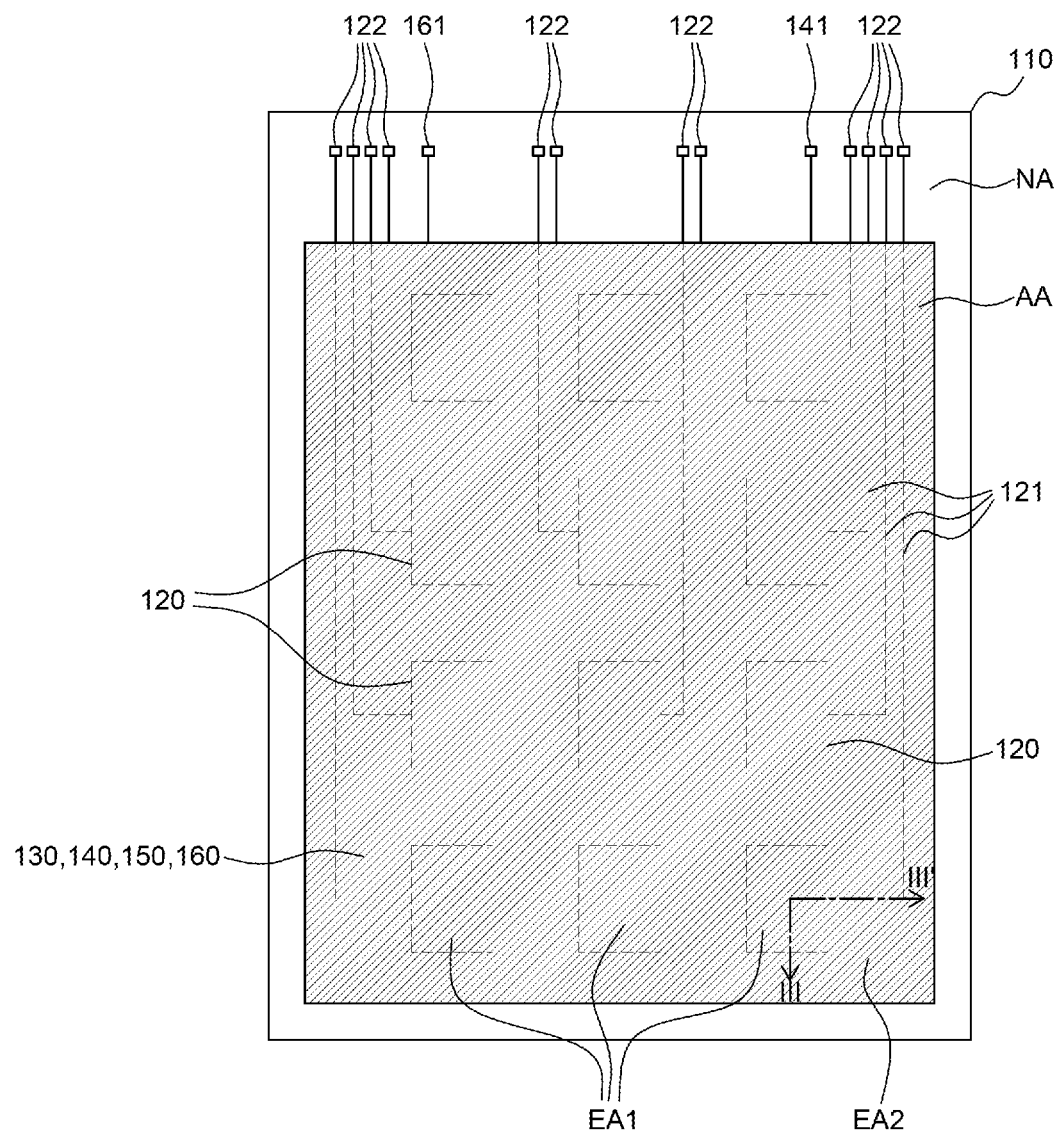
FIG. 2 is a plan view of a lighting device according to an exemplary embodiment of the present disclosure.
Figure 3:
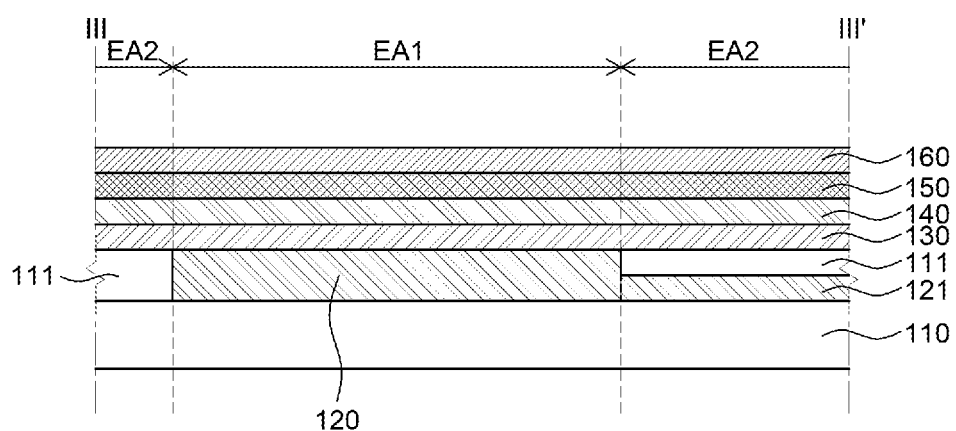
FIG. 3 is a cross-sectional view taken along the line III-III' of FIG. 2.

FIG. 1 is an exploded perspective view of a lighting device according to an exemplary embodiment of the present disclosure. FIG. 2 is a plan view of a lighting device according to an exemplary embodiment of the present disclosure. FIG. 3 is a cross-sectional view taken along the line III-III' of FIG. 2.

Referring to FIGS. 1 to 3, a lighting device 100 according to an exemplary embodiment of the present disclosure includes a substrate 110, an insulating layer 111, a first electrode 160, a first pad 161, an organic light emitting layer 150, a second electrode 140, a second pad 141, a phase change material layer 130, a plurality of third electrodes 120, a plurality of wiring lines 121, and a plurality of third pads 122.

The substrate 110 is a configuration for supporting various components included in the lighting device 100 and may be formed of an insulating material. For example, the substrate 110 may be formed of glass or a plastic material such as polyimide.

Referring to FIG. 1, the substrate 110 includes a display area AA and a non-display area NA.

The display area AA is an area where light of the lighting device 100 is emitted or implemented. In the display area AA, the organic light emitting layer 150 for implementing light and the first electrode 160 and the second electrode 140 which supply electrons and holes to the organic light emitting layer 150 may be disposed.

The non-display area NA is an area where light is not implemented and wiring lines or pads for applying a voltage to the first electrode 160, the second electrode 140 and the plurality of third electrodes 120 disposed in the display area AA are disposed therein.

The organic light emitting layer 150 is disposed on the display area AA of the substrate 110. That is, the organic light emitting layer 150 is a self-emitting element which emits light, with electrons and holes supplied from the first electrode 160 and the second electrode 140 being coupled to implement emission of the light. The organic light emitting layer 150 may emit single color light, for example, may emit one of red color light, green color light, blue color light, and white color light. Hereinafter, it is described that the organic light emitting layer 150 emits white light, but the present disclosure is not limited thereto.

The first electrode 160 is disposed on the organic light emitting layer 150. A lower surface of the first electrode 160 may be disposed to be in contact with the entire upper surface of the organic light emitting layer 150. The first electrode 160 may supply electrons to the organic light emitting layer 150. The first electrode 160 may also be referred to as a cathode.

The first electrode 160 may be formed of a conductive material having a low work function. For example, the first electrode 160 may be formed of any one or more selected from a group consisting of metals having an excellent reflectivity, such as magnesium (Mg), silver (Ag), aluminum (Al), or calcium (Ca) and an alloy thereof, but is not limited thereto.

The first electrode 160 is electrically connected to the first pad 161 to be supplied with a voltage from the first pad 161. The first pad 161 is disposed in the non-display area NA of the substrate 110 to supply a voltage to the first electrode 160.

The second electrode 140 is disposed between the organic light emitting layer 150 and the substrate 110. An upper surface of the second electrode 140 may be disposed to be in contact with the entire lower surface of the organic light emitting layer 150. Further, a lower surface of the second electrode 140 may be disposed to be in contact with the entire upper surface of the phase change material layer 130. The second electrode 140 may supply holes to the organic light emitting layer 150. The second electrode 140 may also be referred to as an anode. Further, the lower surface of the second electrode 140 may be in contact with the entire upper surface of the phase change material layer 130 and supply a voltage to the phase change material layer 130.

The second electrode 140 may be formed of a transparent conductive material having a high work function. For example, the second electrode 140 may be formed of tin oxide (TO), indium tin oxide (ITO), indium zinc oxide (IZO), or indium zinc tin oxide (ITZO), but is not limited thereto.

The second electrode 140 is electrically connected to the second pad 141 to be supplied with a voltage from the second pad 141. The second pad 141 is disposed in the non-display area NA of the substrate 110 to supply a voltage to the second electrode 140.

In the meantime, in the lighting device 100 according to the exemplary embodiment of the present disclosure, the first electrode 160 on the organic light emitting layer 150 is formed of a conductive material having an excellent reflectivity. The second electrode 140 between the organic light emitting layer 150 and the substrate 110 may be formed of a transparent conductive material. Therefore, light emitted from the organic light emitting layer 150 passes through the phase change material layer 130 below the organic light emitting layer 150 to be emitted toward the substrate 110. Accordingly, the lighting device 100 according to the exemplary embodiment of the present disclosure may be implemented to be a bottom emission type.

However, the lighting device 100 according to the exemplary embodiment of the present disclosure is not limited thereto and may also be implemented to be a top emission type. In the case of a top emission type, the phase change material layer 130 and the substrate 110 may be disposed on the organic light emitting layer 150. In this case, the second electrode 140 below the organic light emitting layer 150 is formed of a transparent conductive material having a high work function and a reflective layer formed of a metal material having an excellent reflectivity may be further disposed below the transparent conductive material. Further, the first electrode 160 above the organic light emitting layer 150 is formed of a transparent conductive material so that light emitted from the organic light emitting layer 150 may transmit therethrough. Accordingly, light emitted from the organic light emitting layer 150 passes through the phase change material layer 130 above the organic light emitting layer 150 to be emitted toward the substrate 110.

The phase change material layer 130 is disposed between the second electrode 140 and the substrate 110. The phase change material layer 130 may be transformed into a crystalline state or an amorphous state by the second electrode 140 and the plurality of third electrodes 120 to be described below. The phase change material layer 130 may be formed of a phase change material (PSM). For example, the phase change material may be formed of GST ($Ge_2Sb_2Te_5$) or AIST ($Ag_3In_4Sb_{76}Te_{17}$), but it is not limited thereto.

The phase change material layer 130 may be transformed into a crystalline state and an amorphous state. In the crystalline state, atoms of the phase change material which forms the phase change material layer 130 may be regularly arranged. In the amorphous state, atoms of the phase change material which forms the phase change material layer 130 may be irregularly arranged.

An initial state of the phase change material layer 130 may be an amorphous state. When the phase change material layer 130 is applied with heat of a glass transition temperature (Tg) or higher, the phase change material layer 130 may be transformed from the amorphous state into the crystalline state. In this case, when a voltage is applied to the second electrode 140 and the plurality of third electrodes 120 disposed on both surfaces of the phase change material layer 130, heat may be generated by Joule heating. In this case, a voltage which is applied when it reaches the glass transition temperature may be referred to as a threshold voltage of the phase change material layer 130.

However, after the phase change material layer 130 is transformed into the crystalline state, even though the temperature again becomes equal to or lower than the glass transition temperature Tg, the phase change material 130 does not return to the amorphous state, but is continuously maintained in the crystalline state.

When the phase change material layer 130 which is maintained in a crystalline state is applied with heat of a melting temperature (Tm) or higher which is higher than the glass transition temperature Tg, the phase change material layer 130 may be transformed into the amorphous state. In this case, even though the phase change material layer 130 is cooled to be equal to or lower than a melting temperature, the amorphous state may be continuously maintained. Further, after applying heat of a melting temperature or higher, in order to transform the phase change material layer 130 which is maintained in an amorphous state into the crystalline state again, heat which is equal to or higher than the glass transition temperature Tg and lower than the melting temperature Tm is applied to the phase change material layer 130 to transform the state into the crystalline state.

Therefore, when heat equal to or higher than the glass transition temperature Tg and lower than the melting temperature Tm is applied, the phase change material layer 130 is transformed into the crystalline state. When heat which is equal to or higher than the melting temperature is applied, the phase change material layer 130 may be transformed into the amorphous state.

In the meantime, single color light emitted from the organic light emitting layer 150 may pass through the second electrode 140 and the phase change material layer 130 to be discharged to the outside. In this case, the light emitted from the organic light emitting layer 150 passes through the phase change material layer 130 and is converted into a first color or a second color. For example, when the phase change material layer 130 is in a crystalline state, the light which passes through the phase change material layer 130 may be converted into the first color. For example, when the phase change material layer 130 is in an amorphous state, the light which passes through the phase change material layer 130 may be converted into the second color.

In the meantime, the plurality of third electrodes 120 is disposed between the substrate 110 and the phase change material 130. Upper surfaces of the plurality of third electrodes 120 may be disposed to be in contact with a part of a lower surface of the phase change material layer 130. The plurality of third electrodes 120 may supply a voltage to the phase change material layer 130.

In the meantime, since the light emitted from the organic light emitting layer 150 transmits the second electrode 140, the phase change material layer 130, and the plurality of third electrodes 120 to be discharged to the substrate 110, the plurality of third electrodes 120 may be formed of a transparent conductive material to allow the light to transmit therethrough. For example, the plurality of third electrodes 120 may be formed of tin oxide (TO), indium tin oxide (ITO), indium zinc oxide (IZO), or indium zinc tin oxide (ITZO), but is not limited thereto.

The plurality of third electrodes 120 is electrically connected to the plurality of wiring lines 121 and the plurality of third pads 122 to be supplied with the voltage from the plurality of third pads 122. The plurality of third pads 122 is disposed in the non-display area NA of the substrate 110 to supply a voltage to the plurality of wiring lines 121 and the plurality of third electrodes 120 from a power supply device.

The plurality of wiring lines 121 may be formed of the same material on the same plane as the plurality of third electrodes 120. Specifically, the plurality of wiring lines 121 may electrically connect the plurality of third electrodes 120 in the display area AA to the plurality of third pads 122 in the non-display area NA. At least some of the plurality of wiring lines 121 may be disposed in the display area AA. Therefore, the plurality of wiring lines 121 may be formed of a transparent conductive material to allow the light emitted from the organic light emitting layer 150 to transmit therethrough and may be formed of the same material as the plurality of third electrodes 120. For example, the plurality of wiring lines 121 may be formed of tin oxide (TO), indium tin oxide (ITO), indium zinc oxide (IZO), or indium zinc tin oxide (ITZO), but is not limited thereto.

In the meantime, referring to FIG. 3, an insulating layer 111 is disposed between the plurality of wiring lines 121 and the phase change material layer 130. The insulating layer 111 insulates the plurality of wiring lines 121 from the phase change material layer 130 to suppress phase change of the phase change material layer 130 by a current flowing through the plurality of wiring lines 121.

Hereinafter, a process of implementing patterns with various colors in a lighting device 100 according to an exemplary embodiment of the present disclosure will be described in detail.

Referring to FIGS. 2 and 3, the display area AA includes a plurality of first emission areas EA1 and a second emission area EA2.

The plurality of first emission areas EA1 is areas where the plurality of third electrodes 120 is disposed. Specifically, the plurality of first emission areas EA1 is areas where the second electrode 140 and the third electrode 120 are disposed on both surfaces of the phase change material layer 130. In the plurality of first emission areas EA1, when heat generated by a voltage which is applied to the second electrode 140 and the plurality of third electrodes 120 is applied to the phase change material layer 130, the phase change material layer 130 may be transformed into the crystalline state or the amorphous state in an area overlapping the plurality of first emission areas EA1. Therefore, each of the plurality of first emission areas EA1 may display the first color or the second color in accordance with a state of the phase change material layer 130.

In this case, when a voltage is applied to only some of the plurality of third electrodes 120, the first color or the second color may be displayed only in some of the first emission areas EA1 where some of the third electrodes 120 are disposed. For example, the voltage is applied only to four third electrodes 120 which are disposed in four first emission areas EA1 disposed near four corners of the display area AA to transform a phase change of the phase change material layer 130 disposed in the first emission area EA1. Therefore, the first emission area EA1 corresponding to the third electrode 120 to which the voltage is applied and the first emission area EA1 may corresponding to the third electrode 120 to which the voltage is not applied may display the different colors. By selectively applying the voltage to the plurality of third electrodes 120 according to different colors to transform the phase change of the phase change material layer 130, various patterns having various colors may be implemented in the lighting device 100.

The second emission area EA2 is an area excluding the plurality of first emission areas EA1 from the display area AA. Specifically, the second emission area EA2 is an area where only the second electrode 140 is disposed on an upper surface of the phase change material layer 130 so that a state of the phase change material layer 130 is uniformly maintained regardless of whether the voltage is applied to the plurality of third electrodes 120. In the second emission area EA2, when the initial state of the phase change material layer 130 is a crystalline state, only the first color may be fixedly displayed. Further, when the initial state of the phase change material layer 130 is an amorphous state, only the second color may be fixedly displayed. Hereinafter, change to first color and the second color in accordance with the state change of the phase change material layer 130 will be described in more detail with reference to FIGS. 4A to 4C.

Figure 4A:
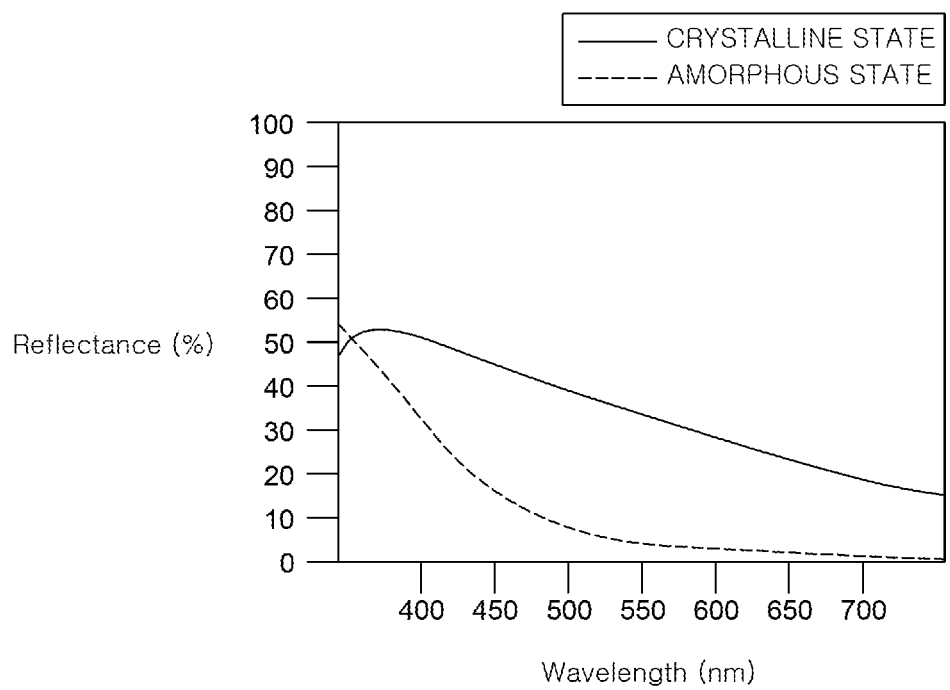
FIGS. 4A to 4C are views for explaining a principle of modifying a color of a lighting device according to an exemplary embodiment of the present disclosure.
Figure 4B:
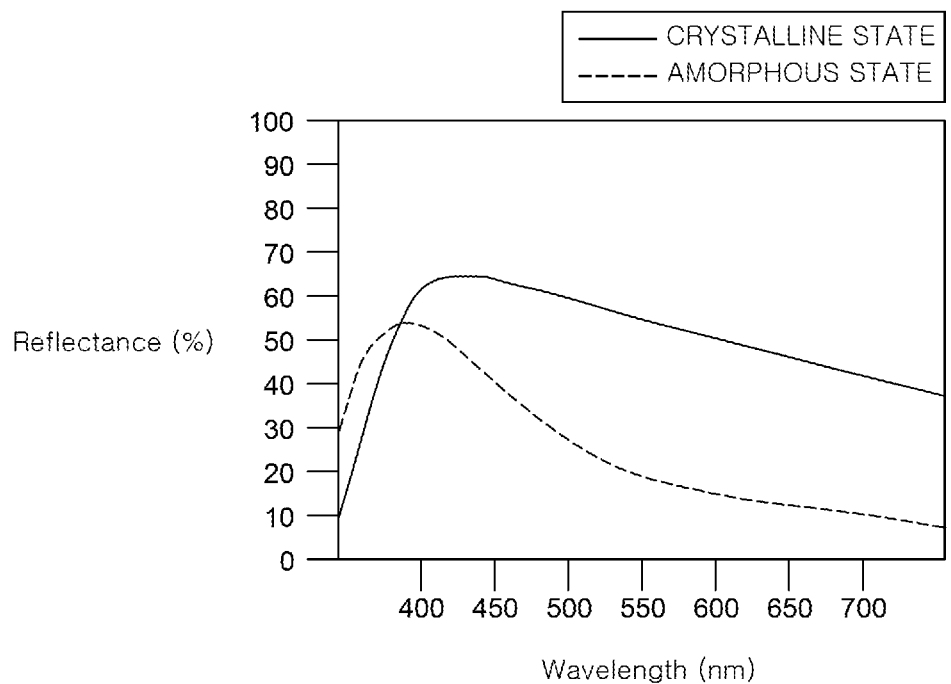
Figure 4C:
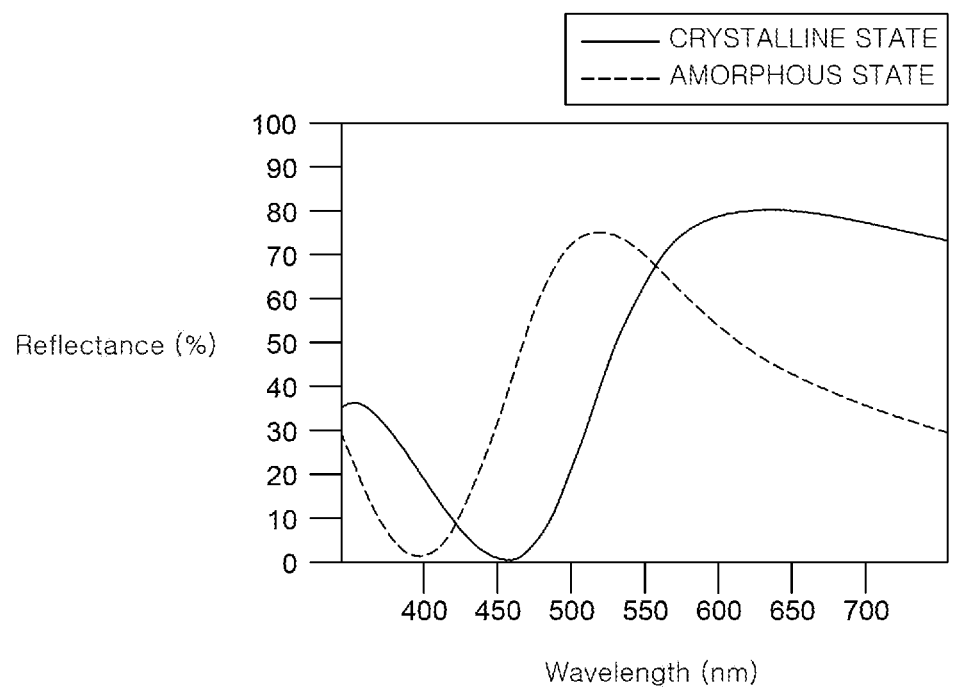

FIGS. 4A to 4C are views for explaining a principle of modifying a color of a lighting device according to an exemplary embodiment of the present disclosure.

A lighting device used in Experimental examples of FIGS. 4A to 4C has a structure in which a reflective layer formed of aluminum (Al) is disposed on a substrate formed of glass, a lower electrode which is formed of indium tin oxide (ITO) is disposed on the reflective layer, a phase change material layer formed of GST ($Ge_2Sb_2Te_5$) is disposed on the lower electrode, and an upper electrode formed of indium tin oxide (ITO) is disposed on the phase change material layer. In Experimental Examples of FIGS. 4A to 4C, the upper electrode is formed to have a thickness of 10 nm, and in Experimental Examples of FIGS. 4A to 4C the phase change material layer is also formed to have a thickness of 10 nm. However, the lower electrode is formed to have a thickness of 50 nm in Experimental Example of FIG. 4A, 70 nm in Experimental Example of FIG. 4B, and 120 nm in Experimental Example of FIG. 4C. In each of Experimental Examples of FIGS. 4A to 4C, reflectance was measured in the crystalline state and the amorphous state of the phase change material layer.

In Experimental Examples of FIGS. 4A to 4C, differently from the lighting device 100 according to the exemplary embodiment of the present disclosure, an organic light emitting layer is not included but the lighting device used in Experimental Examples of FIGS. 4A to 4C may operate as a reflective display device. Therefore, the reflectance in Experimental Examples of FIGS. 4A to 4C may be proportional to luminance of light emitted from the organic light emitting layer 150 of the lighting device 100 according to the exemplary embodiment of the present disclosure.

In FIGS. 4A to 4C, a horizontal axis represents a wavelength of light which is incident onto the lighting device and a vertical axis represents reflectance of light.

Referring to FIG. 4A, when the phase change material layer is in a crystalline state, the lighting device reflects light having a wavelength of approximately 380 nm at maximum and the reflectance of the lighting device is gradually reduced from 380 nm to a longer wavelength. Therefore, when the phase change material layer is in a crystalline state, the lighting device has the maximum reflectance of approximately 52% at a wavelength of 380 nm and has the minimum reflectance of approximately 15% at a wavelength of 750 nm.

In the meantime, when the phase change material layer is in an amorphous state, the lighting device reflects light having a wavelength of approximately 370 nm at maximum and the reflectance of the lighting device is reduced from 370 nm to a longer wavelength. Therefore, in an amorphous state, the lighting device has the maximum reflectance of approximately 55% at a wavelength of 370 nm and has the minimum reflectance of approximately 0% at a wavelength of 750 nm.

Therefore, when the phase change material layer of the lighting device is transformed from the crystalline state to the amorphous state, a peak wavelength having the maximum reflectance is slightly shifted to a short wavelength and the reflectance at a long wavelength may be rapidly lowered. Therefore, when the phase change material layer is in a crystalline state, the lighting device may display blue color. However, in the crystalline state, the reflectance slightly decreases from the short wavelength to the long wavelength, so that pure blue color may not be displayed. When the phase change material layer is in an amorphous state, since the lighting device reflects light in the long wavelength area less than that in the crystalline state, the blue color corresponding to the short wavelength area may be more clearly displayed. Therefore, the lighting device in which the phase change material layer is in an amorphous state may display blue color which is darker than that of the lighting device in which the phase change material layer is in a crystalline state.

Referring to FIG. 4B, when the phase change material layer is in a crystalline state, the lighting device reflects light having a wavelength of approximately 425 nm at maximum and the reflectance of the lighting device is gradually reduced from 425 nm to a longer wavelength. Therefore, in a crystalline state, the lighting device has the maximum reflectance of approximately 65% at a wavelength of 425 nm and has the minimum reflectance of approximately 40% at a wavelength of 750 nm.

In the meantime, when the phase change material layer is in an amorphous state, the lighting device reflects light having a wavelength of approximately 400 nm at maximum and the reflectance of the lighting device is reduced from 400 nm to longer wavelength. Therefore, in an amorphous state, the lighting device has the maximum reflectance of approximately 55% at a wavelength of 420 nm and has the minimum reflectance of approximately 10% at a wavelength of 750 nm.

Therefore, when the phase change material layer of the lighting device is transformed from the crystalline state to the amorphous state, a peak wavelength having the maximum reflectance is slightly shifted to a short wavelength and the reflectance at a long wavelength may be rapidly lowered. Therefore, when the phase change material layer is in a crystalline state, the lighting device may display blue color. However, in the crystalline state, the reflectance slightly decreases from the short wavelength to the long wavelength, so that pure blue color may not be displayed. When the phase change material layer is in an amorphous state, since the lighting device reflects light in the long wavelength area less than that in the crystalline state, the blue color corresponding to the short wavelength area may be more clearly displayed. Therefore, the lighting device in which the phase change material layer is in an amorphous state may display blue color which is darker than that of the lighting device in which the phase change material layer is in a crystalline state.

Referring to FIG. 4C, when the phase change material layer is in a crystalline state, the lighting device reflects light having a wavelength of approximately 600 nm at maximum and reflects light having a wavelength of 470 nm at minimum. Further, the reflectance of the lighting device gradually decreases from 600 nm to a longer wavelength. The reflectance of the lighting device rapidly decreases from 600 nm to 470 nm. Therefore, when the phase change material layer is in a crystalline state, the lighting device has the maximum reflectance of approximately 80% at a wavelength of 600 nm and has the minimum reflectance of approximately 0% at a wavelength of 470 nm.

In the meantime, when the phase change material layer is in an amorphous state, the lighting device reflects light having a wavelength of approximately 520 nm at maximum and the reflectance of the lighting device decreases from 520 nm to a long wavelength and a short wavelength. Therefore, when the phase change material layer is in an amorphous state, the lighting device has the maximum reflectance of approximately 75% at a wavelength of 520 nm and has the minimum reflectance of approximately 0% at a wavelength of 410 nm.

Therefore, when the phase change material layer of the lighting device is transformed from the crystalline state to the amorphous state, a peak wavelength having the maximum reflectance slightly is shifted to a short wavelength and the reflectance at a long wavelength may be rapidly lowered. Therefore, when the phase change material layer is in a crystalline state, the lighting device may display orange color. Further, when the phase change material layer is in an amorphous state, the lighting device reflects light in the long wavelength area less than that in the crystalline state of the phase change material layer and green color corresponding to a wavelength of approximately 520 nm is reflected at maximum. Therefore, the lighting device in which the phase change material layer is in an amorphous state may display green color.

In summary, reflectance for every wavelength of the lighting device may vary depending on a phase change or phase change state of the phase change material layer. The reflectance for every wavelength of the lighting device may vary depending on whether the phase change material layer is in an amorphous state or a crystalline state and the peak wavelength band may vary. Therefore, when the phase change material layer 130 in the lighting device 100 according to the exemplary embodiment of the present disclosure is used, various colors of light may be implemented in the lighting device 100, based on phase change state of the phase change material layer 130 and the color of light of emitted from the organic light emitting layer 150. Therefore, in the lighting device 100 according to the exemplary embodiment of the present disclosure, the phase change material layer 130 is transformed to a crystalline state or an amorphous state to implement various colors of light.

In the meantime, a wavelength of the maximum reflectance and a reflectance of the lighting device may vary depending on a thickness of the above-described lower electrode. For example, referring to FIGS. 4A to 4C, in both the amorphous state and the crystalline state of the phase change material layer, as the thickness of the lower electrode is increased, the peak wavelength is shifted from a short wavelength to a long wavelength. That is, as the lower electrode is thinner, the peak wavelength having the maximum reflectance is the relatively short wavelength. As the lower electrode is thicker, the peak wavelength having the maximum reflectance is the relatively long wavelength. Therefore, even though the phase change state of the phase change material layer is the same, various colors of light may be implemented by adjusting the thickness of the lower electrode, that is, the thickness of the second electrode 140 in the lighting device 100 according to the exemplary embodiment of the present disclosure.

Since the lighting device using an organic light emitting layer of the related art uses an organic light emitting layer which emits only single color light, only single color may be represented. For example, in the lighting device of the related art, one organic light emitting layer which emits white light is disposed on a front surface of the lighting device. Therefore, the lighting device of the related art may display only white light. In order to implement a specific pattern in the lighting device of the related art, a pattern may be implemented by covering an emission area of the lighting device with a cover with a specific pattern shape. However, even though the pattern is implemented, the lighting device may implement only single color light so that there is a limitation in implementing various colors and various patterns.

However, in the lighting device 100 according to the exemplary embodiment of the present disclosure, the phase change material layer 130 is disposed between the organic light emitting layer 150 and the substrate 110 to change colors of light of the lighting device 100 in accordance with the phase change of the phase change material layer 130. Therefore, various colors and patterns may be implemented in the lighting device 100. Specifically, in the lighting device 100 according to the exemplary embodiment of the present disclosure, an organic light emitting layer 150 which emits only single color light is disposed and the phase change material layer 130 is disposed between the organic light emitting layer 150 and the substrate 110. The phase change material layer 130 may be transformed to a crystalline state or an amorphous state by a voltage applied between the second electrode 140 on an upper surface of the phase change material layer 130 and the plurality of third electrodes 120 on a lower surface thereof, that is, heat by Joule heating. The reflectance and a wavelength of reflected light may vary depending on whether the phase change material layer 130 is in a crystalline state or an amorphous state. Therefore, the light from the organic light emitting layer 150 passes through the phase change material layer 130 to be converted into a first color or a second color. In this case, the entire phase change material layer 130 is not transformed to the crystalline state or the amorphous state, but the phase change material layer 130 is transformed to the crystalline state or the amorphous state only in an area of the plurality of third electrodes 120 which is in contact with the phase change material layer 130. Therefore, when the voltage is selectively applied to the plurality of third electrodes 120, the lighting device 100 may simultaneously display the first color and the second color or display any one of the first color and the second color, based on an area where the plurality of third electrodes 120 is disposed and the voltage is applied. In this case, the color of light which transmits the phase change material layer 130 to be displayed on the organic light emitting layer 150 may vary depending on a phase change state of the phase change material layer 130, a color of the organic light emitting layer 150, and a type of phase change material. Therefore, the lighting device 100 according to the exemplary embodiment of the present disclosure may implement a pattern having various shapes and colors so that a degree of design freedom may be increased.

Further, in the lighting device 100 according to the exemplary embodiment of the present disclosure, the phase change material layer 130 and the organic light emitting layer 150 share the second electrode 140, so that the structure may be simplified. Specifically, for the purpose of phase change of the phase change material layer 130, the second electrode 140 and the plurality of third electrodes 120 are disposed on both surfaces of the phase change material layer 130. Further, in order to emit light from the organic light emitting layer 150, the first electrode 160 and the second electrode 140 are disposed on both surfaces of the organic light emitting layer 150. Therefore, in the lighting device 100 according to the exemplary embodiment of the present disclosure, the second electrode 140 serves as an electrode for causing the organic light emitting layer 150 to emit light. The second electrode 140 serves as an electrode for phase change of the phase change material layer 130. Therefore, the structure of the lighting device 100 may be simplified and the thickness thereof may be reduced.

Figure 5:
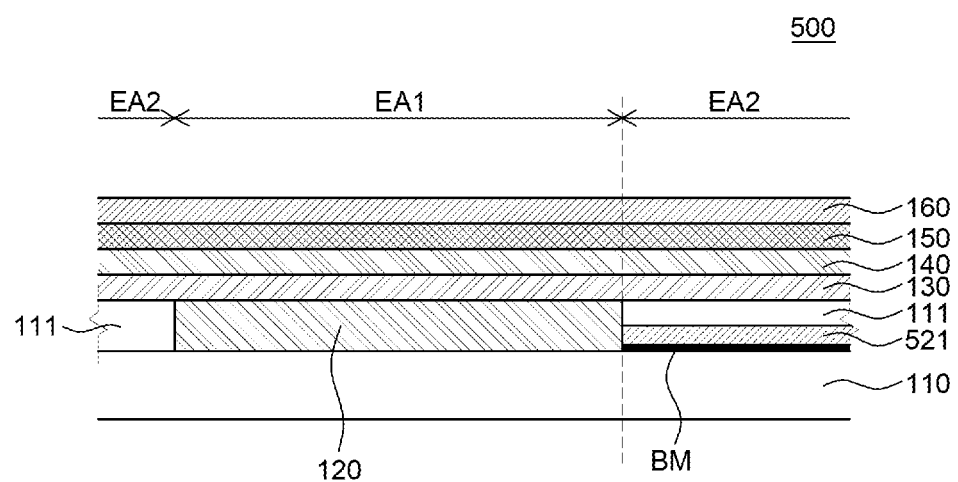
FIG. 5 is a cross-sectional view of a lighting device according to another exemplary embodiment of the present disclosure.

FIG. 5 is a cross-sectional view of a lighting device according to another exemplary embodiment of the present disclosure. A lighting device 500 of FIG. 5 is different from the lighting device 100 of FIGS. 1 to 3 in that a plurality of wiring lines 521 is different and a black matrix BM is further included, but other configurations are substantially the same, so that a redundant description will be omitted.

Referring to FIG. 5, the plurality of wiring lines 521 may be formed of a metal material. For example, the plurality of wiring lines 521 may be configured by copper (Cu), aluminum (Al), molybdenum (Mo), nickel (Ni), titanium (Ti), chrome (Cr), or an alloy thereof, but is not limited thereto.

The black matrix BM is disposed between the plurality of wiring lines 521 and the substrate 110. Since the plurality of wiring lines 521 is formed of a metal material having a good reflectivity, the black matrix BM is disposed on the plurality of wiring lines 521 to minimize the reflection of external light from the plurality of wiring lines 521.

In the lighting device 500 according to another exemplary embodiment of the present disclosure, the plurality of wiring lines 521 is formed of a metal material and the black matrix BM is disposed between the plurality of wiring lines 521 and the substrate 110. Specifically, when the plurality of wiring lines 521 is formed of a transparent conductive material such as indium tin oxide (ITO) or indium zinc oxide (IZO), the external light is not reflected but transmitted, so that the black matrix BM may not be disposed. However, the transparent conductive material has a high specific resistance as compared with the metal material, so that it may be disadvantageous in terms of power consumption and heat generation. Therefore, in the lighting device 500 according to another exemplary embodiment of the present disclosure, the plurality of wiring lines 521 is formed of a metal material having a low specific resistance to reduce an amount of generated heat and improve power consumption. Further, the black matrix BM is used to suppress the plurality of wiring lines 521 from being recognized.

Figure 6:
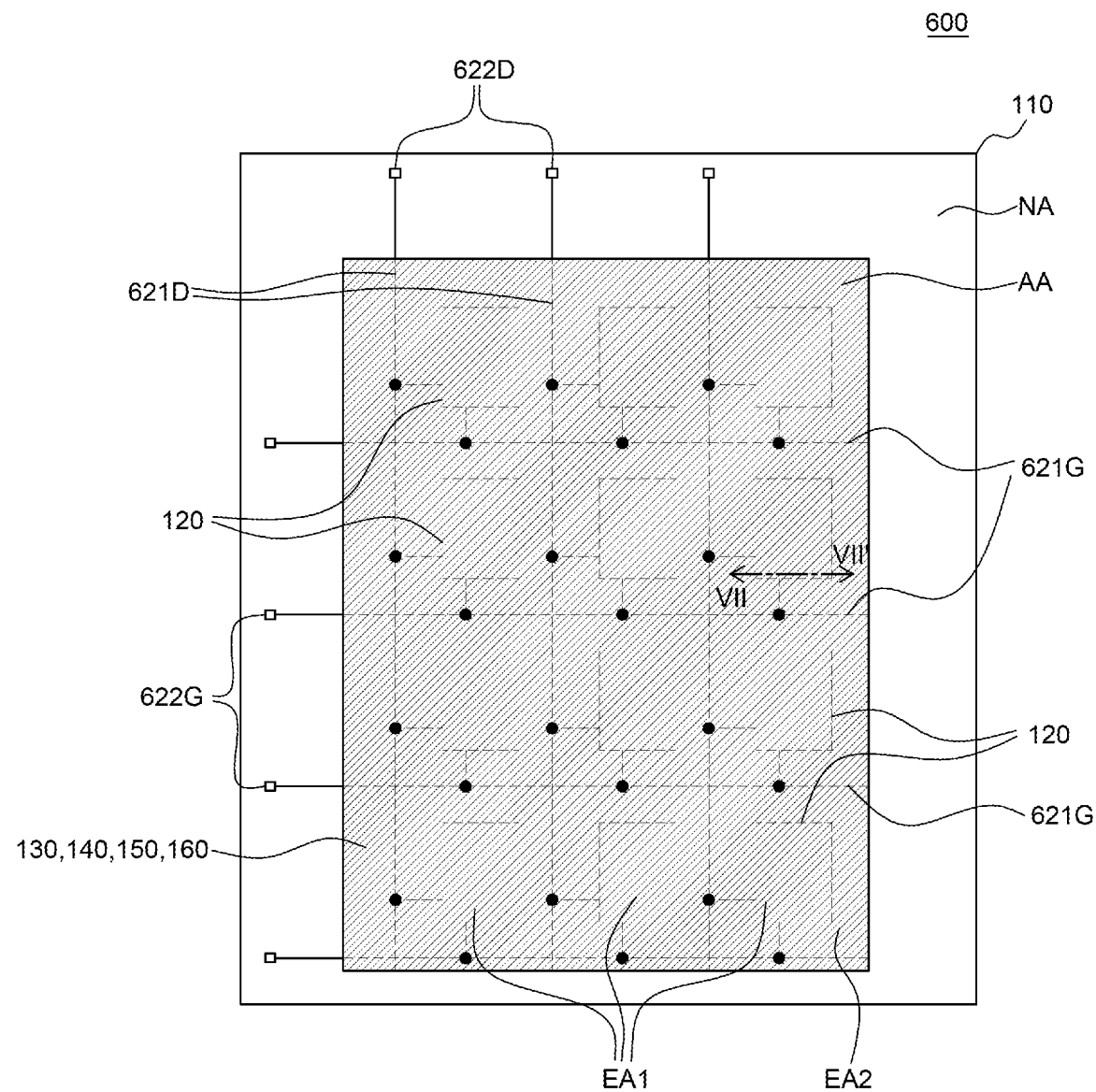
FIG. 6 is a plan view of a lighting device according to still another exemplary embodiment of the present disclosure.
Figure 7:
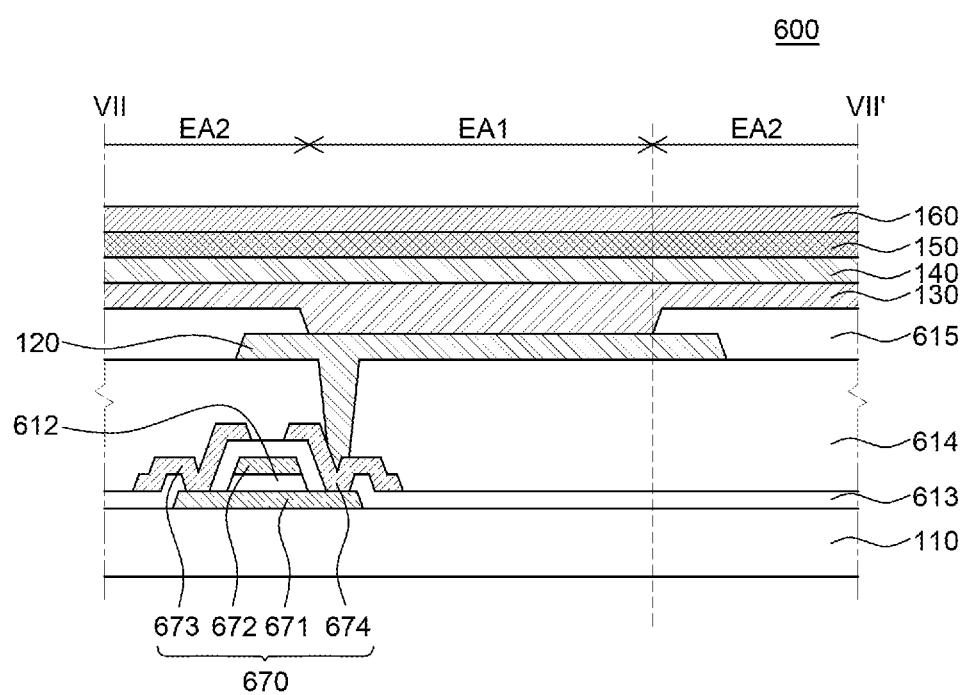
FIG. 7 is a cross-sectional view taken along the line VII-VII' of FIG. 6.

FIG. 6 is a plan view of a lighting device according to still another exemplary embodiment of the present disclosure. FIG. 7 is a cross-sectional view taken along the line VII-VII' of FIG. 6. Only a plurality of thin film transistors 670, a plurality of gate lines 621G, a plurality of data lines 621D, a plurality of third gate pads 622G, and a plurality of third data pads 622D of a lighting device 600 of FIGS. 6 and 7 are different from those of the lighting device 100 of FIGS. 1 to 3. Other configurations are substantially the same, so that a redundant description will be omitted.

Referring to FIGS. 6 and 7, the lighting device 600 according to another exemplary embodiment of the present disclosure further includes a plurality of thin film transistors 670. The plurality of thin film transistors 670 is disposed between the substrate 110 and the plurality of third electrodes 120 and is electrically connected to the plurality of third electrodes 120. Further, the plurality of gate lines 621G and the plurality of data lines 621D are connected to the plurality of thin film transistors 670, respectively.

The plurality of gate lines 621G is connected to the plurality of third gate pads 622G disposed in the non-display area NA. The plurality of gate pads 622G supplies gate voltages to the plurality of gate lines 621G.

The plurality of data lines 621D is connected to the plurality of third data pads 622D disposed in the non-display area NA. The plurality of third data pads 622D supplies data voltages to the plurality of data lines 621D.

Referring to FIG. 7, an active layer 671 of the thin film transistor 670 is disposed on the substrate 110.

A gate electrode 672 is disposed on the active layer 671. The gate electrode 672 is supplied with the gate voltage from the gate line 621G to turn on or off the thin film transistor 670.

A gate insulating layer 612 is disposed between the gate electrode 672 and the active layer 671. The gate insulating layer 612 is a layer for insulating the gate electrode 672 from the active layer 671 and may be formed of an insulating material. For example, the gate insulating layer 612 may be configured by a single layer or a double layer of silicon oxide (SiOx) or silicon nitride (SiNx), but is not limited thereto.

An interlayer insulating layer 613 is disposed on the gate electrode 672. The interlayer insulating layer 613 is a layer for protecting configurations below the interlayer insulating layer 613. The interlayer insulating layer 613 may be formed of the same material as the gate insulating layer 612. For example, the interlayer insulating layer 613 may be configured by a single layer or a double layer of silicon oxide (SiOx) or silicon nitride (SiNx), but is not limited thereto.

A source electrode 673 and a drain electrode 674 are disposed on the interlayer insulating layer 613. The source electrode 673 and the drain electrode 674 are electrically connected to the active layer 671 through a contact hole formed in the interlayer insulating layer 613. In this case, the source electrode 673 receives the data voltage from the data line 621D to transmit the data voltage to the drain electrode 674 and the third electrode 120. The source electrode 673 and the drain electrode 674 may be formed of a conductive material. For example, the source electrode 673 and the drain electrode 674 may be configured by copper (Cu), aluminum (Al), molybdenum (Mo), nickel (Ni), titanium (Ti), chrome (Cr), or an alloy thereof, but are not limited thereto.

A planarization layer 614 is disposed on the thin film transistor 670. The planarization layer 614 planarizes an upper portion of the substrate 110. The planarization layer 614 may be configured by a single layer or a double layer and may be formed of an organic material. For example, the planarization layer 614 may be formed of an acrylic-based organic material, but is not limited thereto.

The plurality of third electrodes 120 is disposed on the planarization layer 614 and a bank 615 is disposed on the third electrode 120. The bank 615 may be disposed to cover only an edge of the third electrode 120 to open a part of the upper surface of the third electrode 120 and may be formed of an organic insulating material.

The lighting device 600 according to still another exemplary embodiment of the present disclosure drives the plurality of third electrodes 120 in an active matrix manner by disposing the plurality of thin film transistors 670 in the plurality of third electrodes 120. Therefore, the phase change of the phase change material layer 130 may be more precisely and rapidly performed for every first emission area EA1 through the thin film transistor 670. Therefore, the lighting device 600 according to another exemplary embodiment of the present disclosure may dispose the thin film transistor 670 to advantageously control a fine pattern represented by the lighting device 600 and quickly change the color of the lighting device 600 to improve a degree of design freedom and a performance of the lighting device 600.

Figure 8:
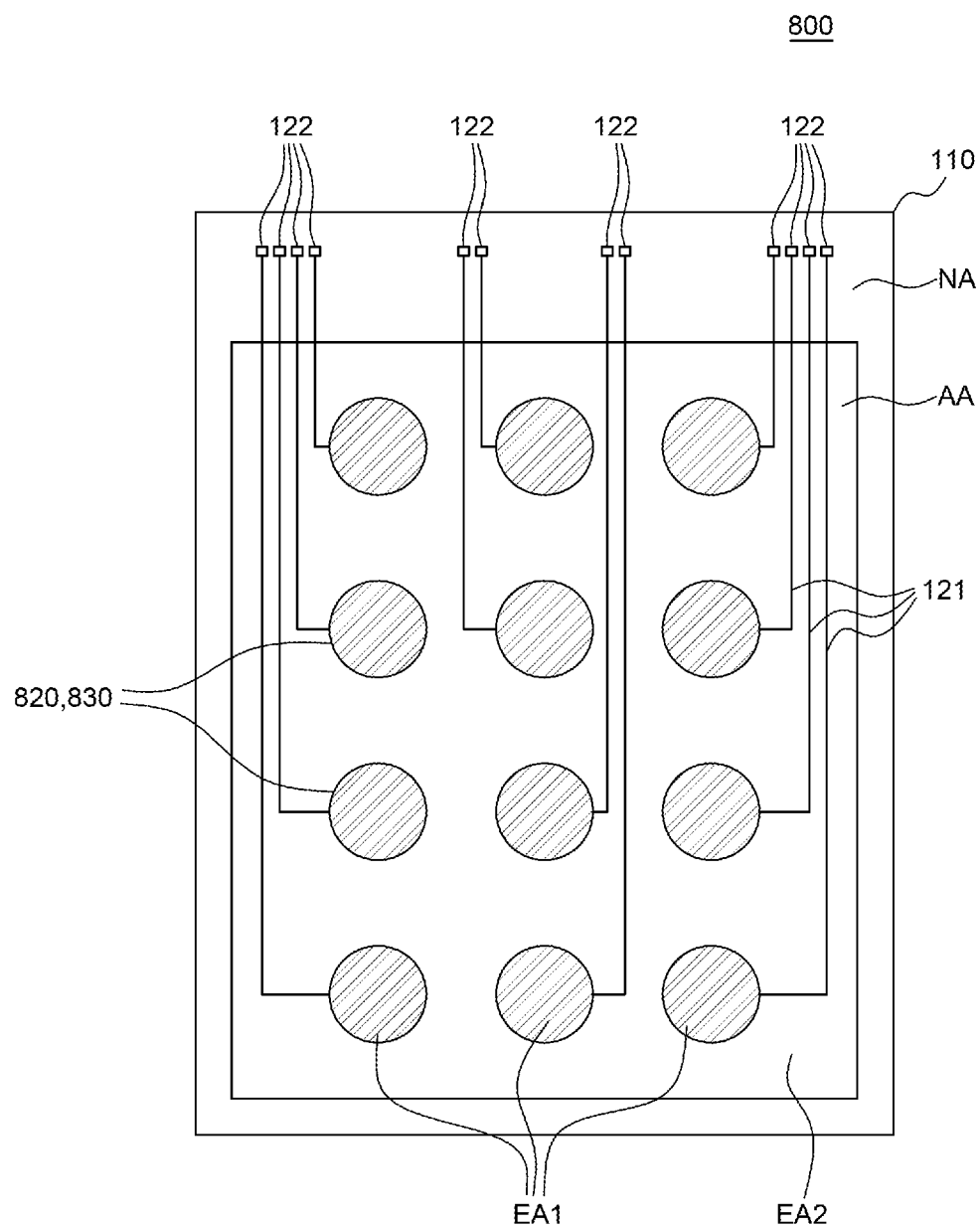
FIG. 8 is a plan view of a lighting device according to still another exemplary embodiment of the present disclosure.

FIG. 8 is a plan view of a lighting device according to still another exemplary embodiment of the present disclosure. Only a plurality of phase change material layers 830 and a plurality of third electrodes 820 of a lighting device 800 of FIG. 8 are different from those of the lighting device 100 of FIGS. 1 to 3, but other configurations are substantially the same, so that a redundant description will be omitted. In FIG. 8, only a substrate 110, a plurality of phase change material layers 830, a plurality of third electrodes 820, a plurality of wiring lines 121, and a plurality of third pads 122 among various configurations of the lighting device 800 are illustrated for the convenience of description.

Referring to FIG. 8, the plurality of phase change material layers 830 and a plurality of third electrodes 820 are disposed to form one-to-one correspondence. That is, each of the plurality of phase change material layers 830 and each of the plurality of third electrodes 820 are disposed to overlap each other and as illustrated in FIG. 8, may be disposed to completely overlap each other.

The plurality of phase change material layers 830 and the plurality of electrodes 820 may have various shapes. As it will be described below, the shapes of the plurality of phase change material layers 830 and the plurality of third electrodes 820 determine a shape of the first emission area EA1. Therefore, the shapes of the plurality of phase change material layers 830 and the plurality of third electrodes 820 may be determined based on various colors and patterns to be represented by the lighting device 800. Even though in FIG. 8, it is illustrated that the plurality of phase change material layers 830 and the plurality of third electrodes 820 have a circular shape, the shapes of the plurality of phase change material layers 830 and the plurality of third electrodes 820 are not limited thereto.

In the meantime, the display area AA includes a plurality of first emission areas EA1 and a second emission area EA2.

The plurality of first emission areas EA1 is areas where the plurality of third electrodes 820 and the plurality of phase change material layers 830 are disposed. Specifically, the plurality of first emission areas EA1 is areas where both the plurality of third electrodes 820 and the plurality of phase change material layers 130 are disposed. In the plurality of first emission areas EA1, when heat generated by a voltage which is applied to the second electrode 140 and the plurality of third electrodes 820 is applied to the plurality of phase change material layers 830, each of the plurality of phase change material layer 830 may be transformed to the crystalline state or the amorphous state. Therefore, in each of the plurality of first emission areas EA1, each of the plurality of phase change material layers 830 may be transformed to a crystalline state or an amorphous state depending on a voltage which is applied to the plurality of third electrodes 820. Therefore, each of the plurality of first emission areas EA1 may display the first color or the second color.

The second emission area EA2 is an area excluding the first emission area EA1 from the display area AA. Specifically, the second emission area EA2 is an area where the phase change material layer 830 is not disposed but only the second electrode 140 is disposed on an upper surface of the organic light emitting layer 150 so that light emitted from the organic light emitting layer is emitted regardless of the state of the phase change material layer 830 and whether to apply a voltage to the plurality of third electrodes 820. Therefore, in the second emission area EA2, colors of light emitted from the organic light emitting layer 150 may be displayed.

In the lighting device 800 according to still another exemplary embodiment of the present disclosure, the plurality of third electrodes 820 and the plurality of phase change material layers 830 are disposed only in a partial area of the display area AA to display three colors including the first color and the second color by the phase change of the phase change material layer 830 and a color of light emitted from the organic light emitting layer 150. Specifically, in the display area AA where the phase change material layer 830 is not disposed, the color of light emitted from the organic light emitting layer 150 may be displayed regardless of the phase change of the phase change material layer 830. In the display area AA in which the phase change material layer 830 is disposed, any one of the first color or the second color may be displayed in accordance with the phase change of the phase change material layer 830. Therefore, the lighting device 800 according to still another exemplary embodiment of the present disclosure may provide illuminations having various colors.

Further, the lighting device 800 according to still another exemplary embodiment of the present disclosure freely modifies shapes of the plurality of phase change material layers 830 and the plurality of third electrodes 820 to provide illuminations with various patterns. Specifically, the plurality of phase change material layers 830 and the plurality of third electrodes 820 having a specific shape are disposed to form one-to-one correspondence. Further, the shapes of the plurality of phase change material layers 830 and the plurality of third electrodes 820 may define the plurality of first emission areas EA1. Therefore, patterns in the lighting device 800 may be freely implemented by changing shapes of the plurality of phase change material layers 830 and the plurality of third electrodes 820. Accordingly, the lighting device 800 according to still another exemplary embodiment of the present disclosure freely modifies shapes of the plurality of phase change material layers 830 and the plurality of third electrodes 820 to implement illuminations with various patterns, thereby increasing a degree of design freedom.

Figure 9:
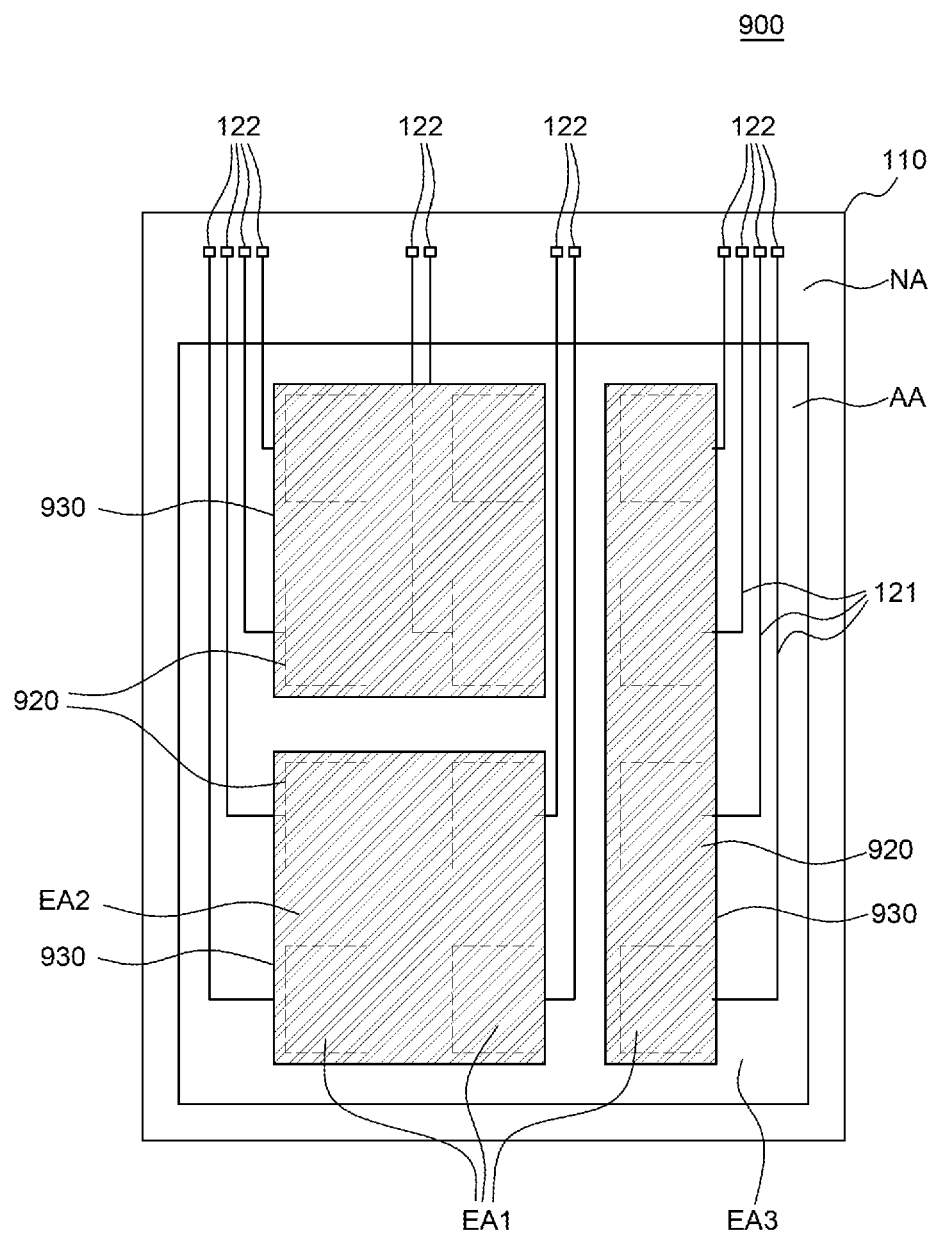
FIG. 9 is a plan view of a lighting device according to still another exemplary embodiment of the present disclosure.

FIG. 9 is a plan view of a lighting device according to still another exemplary embodiment of the present disclosure. Only a plurality of phase change material layers 930 and a plurality of third electrodes 920 of a lighting device 900 of FIG. 9 are different from those of the lighting device 800 of FIG. 8, but other configurations are substantially the same, so that a redundant description will be omitted.

Referring to FIG. 9, the lighting device 900 according to still another exemplary embodiment of the present disclosure includes a plurality of phase change material layers 930 and a plurality of third electrodes 920. The plurality of phase change material layers 930 and the plurality of third electrodes 920 may have a rectangular shape. The plurality of phase change material layers 930 may be in contact with two or more of the plurality of third electrodes 920.

In the meantime, the display area AA includes a plurality of first emission areas EA1, a plurality of second emission areas EA2, and a third emission area EA3.

The plurality of first emission areas EA1 is areas where the plurality of third electrodes 920 is disposed. Specifically, the plurality of first emission areas EA1 is areas where the second electrode 140 and the plurality of third electrodes 920 are disposed on both surfaces of the phase change material layer 930. In the plurality of first emission areas EA1, when heat generated by a voltage which is applied to the second electrode 140 and the plurality of third electrodes 920 is applied to the plurality of phase change material layers 930, the plurality of phase change material layers 930 may be transformed into the crystalline state or the amorphous state in an area overlapping the first emission area EA1. Therefore, each of the plurality of first emission areas EA1 may display the first color or the second color in accordance with a state of the phase change material layer 930.

The plurality of second emission areas EA2 is areas, excluding the plurality of first emission areas EA1, in an area where the plurality of phase change material layers 930 is disposed. Specifically, the plurality of second emission areas EA2 is areas where only the second electrode 140 is disposed on an upper surface of the phase change material layer 930 so that a state of the phase change material layer 930 is uniformly maintained regardless of whether the voltage is applied to the plurality of third electrodes 920. In the plurality of second emission areas EA2, when the initial state of the phase change material layer 930, for example, the initial state of the phase change material layer 930 is a crystalline state, only the first color may be fixedly displayed. Further, when the initial state of the phase change material layer 930 is an amorphous state, only the second color may be fixedly displayed.

The third emission area EA3 is an area excluding the first emission areas EA1 and the second emission areas EA2 from the display area AA. Specifically, the third emission area EA3 is an area where the phase change material layer 930 is not disposed but only the second electrode 140 is disposed on an upper surface of the organic light emitting layer 150 so that light emitted from the organic light emitting layer 150 is emitted regardless of the state of the phase change material layer 930 and whether to apply a voltage to the plurality of third electrodes 920. Therefore, in the third emission area EA3, colors of light emitted from the organic light emitting layer 150 may be displayed.

In the lighting device 900 according to still another exemplary embodiment of the present disclosure, the plurality of phase change material layers 930 and the plurality of third electrodes 920 are disposed only in a partial area of the display area AA. Specifically, the display area AA of the lighting device 900 is divided into an area where only a color of light emitted from the organic light emitting layer 150 is displayed, an area where the first color or the second color by the phase change of the phase change material layer 930 is selectively displayed, and an area where the first color or the second color is fixedly displayed depending on an initial state of the phase change material layer 930. Therefore, three colors including the first color and the second color by the phase change material layer 930 and a color of light emitted from the organic light emitting layer 150 may be displayed in the display area AA. Specifically, in the first emission area EA1 where the plurality of third electrodes 920 and the phase change material layer 930 are disposed, as the phase change material layer 930 is phase-transformed, the first color or the second color may be selectively displayed. In the second emission area EA2 where only the phase change material layer 930 is disposed without disposing the plurality of third electrodes 920, any one of the first color and the second color may be fixedly displayed depending on the initial state of the phase change material layer 930. In the third emission area EA3 where the phase change material layer 930 is not disposed, the color of light emitted from the organic light emitting layer 150 may be displayed. Therefore, in the lighting device 900 according to still another exemplary embodiment of the present disclosure, the plurality of phase change material layers 930 is disposed only in a partial area of the display area AA, to provide illuminations with various colors.

Further, the lighting device 900 according to still another exemplary embodiment of the present disclosure freely modifies shapes of the plurality of phase change material layers 930 and the plurality of third electrodes 920 to provide illuminations with various patterns. Further, in one of the plurality of phase change material layers 930 having a specific pattern, two or more third electrodes 920 among the plurality of third electrodes 920 are disposed. Further, the shape of the plurality of phase change material layers 930 and the shape of the plurality of third electrodes 920 may define the first emission area EA1, the second emission area EA2, and third emission area EA3. Therefore, patterns in the lighting device 900 may be freely implemented by changing shapes of the plurality of phase change material layers 930 and the plurality of third electrodes 920. Accordingly, the lighting device 900 according to still another exemplary embodiment of the present disclosure freely modifies shapes of the plurality of phase change material layers 930 and the plurality of third electrodes 920 to implement illuminations with various patterns, thereby increasing a degree of design freedom.

The exemplary embodiments of the present disclosure can also be described as follows:

According to an aspect of the present disclosure, a lighting device includes: a substrate including a display area and a non-display area, an organic light emitting layer disposed in the display area, a first electrode disposed on the organic light emitting layer and a second electrode disposed below the organic light emitting layer, a phase change material layer disposed below the second electrode, and a plurality of third electrodes disposed between the substrate and the phase change material layer.

The second electrode and the plurality of third electrodes may be formed of transparent conductive materials.

An entire upper surface of the organic light emitting layer may be in contact with a lower surface of the first electrode and an entire upper surface of the phase change material layer may be in contact with a lower surface of the second electrode.

The lighting device may further include a plurality of pads disposed in the non-display area, a plurality of wiring lines which electrically connects the plurality of third electrodes to the plurality of pads and an insulating layer disposed between the plurality of wiring lines and the phase change material layer.

The plurality of wiring lines may be formed of the same material on the same plane as the plurality of third electrodes.

The lighting device may further include a black matrix disposed between the substrate and the plurality of wiring lines. The plurality of wiring lines may be formed of a metal material.

The lighting device may further include a plurality of thin film transistors which is disposed between the substrate and the plurality of third electrodes in the display area. The plurality of thin film transistors may be electrically connected to the plurality of third electrodes.

The display area may include a plurality of first emission areas in which the plurality of third electrodes is disposed and a second emission area excluding the plurality of first emission areas.

The plurality of first emission areas may display a first color or a second color in accordance with phase change of the phase change material layer and the second emission area displays only one of the first color and the second color.

The phase change material layer may be transformed into a crystalline state or an amorphous state by voltages which are applied to the plurality of third electrodes and the second electrode.

A color of light emitted in the display area may be determined based on a color of light emitted by the organic light emitting layer and phase change of the phase change material layer.

According to another aspect of the present disclosure, a lighting device includes: a substrate including a display area and a non-display area, a plurality of third electrodes disposed on the substrate, a plurality of phase change material layers which is disposed on the plurality of third electrodes and is spaced apart from each other, a second electrode disposed on the plurality of phase change material layers, an organic light emitting layer disposed on the second electrode and a first electrode disposed on the organic light emitting layer.

Each of the plurality of phase change material layers may be in contact with two or more of the plurality of third electrodes.

The display area may include a plurality of first emission areas in which the plurality of third electrodes is disposed, a plurality of second emission areas excluding the plurality of first emission areas from an area where the plurality of phase change material layers is disposed and a third emission area excluding an area where the plurality of phase change material layers is disposed.

The plurality of first emission areas may display a first color or a second color in accordance with phase change of the plurality of phase change material layers, the plurality of second emission areas may display only one of the first color and the second color, and the third emission area may display a color of light emitted by the organic light emitting layer.

The plurality of phase change material layers and the plurality of third electrodes may be disposed to form one to one correspondence.

The display area may include a plurality of first emission areas in which the plurality of third electrodes and the plurality of phase change material layers are disposed and a second emission area excluding the plurality of first emission areas.

The plurality of first emission areas may display a first color or a second color in accordance with phase change of the plurality of phase change material layers and the second emission area may display a color of light emitted by the organic light emitting layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A lighting device, comprising:
   a substrate including a display area and a non-display area;
   an organic light emitting layer disposed in the display area;
   a first electrode disposed on the organic light emitting layer and a second electrode disposed below the organic light emitting layer;
   a phase change material layer disposed below the second electrode; and
   a plurality of third electrodes disposed between the substrate and the phase change material layer.

2. The lighting device according to claim 1, wherein the second electrode and the plurality of third electrodes are formed of transparent conductive materials.

3. The lighting device according to claim 1, wherein an entire upper surface of the organic light emitting layer is in contact with a lower surface of the first electrode and an entire upper surface of the phase change material layer is in contact with a lower surface of the second electrode.

4. The lighting device according to claim 1, further comprising:
   a plurality of pads disposed in the non-display area;
   a plurality of wiring lines electrically connecting the plurality of third electrodes to the plurality of pads; and
   an insulating layer disposed between the plurality of wiring lines and the phase change material layer.

5. The lighting device according to claim 4, wherein the plurality of wiring lines is formed of a same material and on a same plane as the plurality of third electrodes.

6. The lighting device according to claim 4, further comprising:
   a black matrix disposed between the substrate and the plurality of wiring lines,
   wherein the plurality of wiring lines is formed of a metal material.

7. The lighting device according to claim 1, further comprising:
   a plurality of thin film transistors disposed between the substrate and the plurality of third electrodes in the display area,
   wherein the plurality of thin film transistors is electrically connected to the plurality of third electrodes.

8. The lighting device according to claim 1, wherein the display area includes:
   a plurality of first emission areas in which the plurality of third electrodes is disposed; and
   a second emission area excluding the plurality of first emission areas.

9. The lighting device according to claim 8, wherein the plurality of first emission areas display a first color or a second color in accordance with a phase change of the phase change material layer and the second emission area displays only one of the first color and the second color.

10. The lighting device according to claim 1, wherein the phase change material layer is transformed into a crystalline state or an amorphous state in response to voltages applied to the plurality of third electrodes and the second electrode.

11. The lighting device according to claim 10, wherein a color of light emitted in the display area is determined based on a color of light emitted by the organic light emitting layer and a phase change of the phase change material layer.

12. A lighting device, comprising:
    a substrate including a display area and a non-display area;
    a plurality of third electrodes disposed on the substrate;
    a plurality of phase change material layers disposed on the plurality of third electrodes, the plurality of phase change material layers spaced apart from each other;
    a second electrode disposed on the plurality of phase change material layers;
    an organic light emitting layer disposed on the second electrode; and
    a first electrode disposed on the organic light emitting layer.

13. The lighting device according to claim 12, wherein each of the plurality of phase change material layers is in contact with two or more of the plurality of third electrodes.

14. The lighting device according to claim 13, wherein the display area includes:
    a plurality of first emission areas in which the plurality of third electrodes is disposed;
    a plurality of second emission areas, excluding the plurality of first emission areas, in an area where the plurality of phase change material layers is disposed; and
    a third emission area excluding an area where the plurality of phase change material layers is disposed.

15. The lighting device according to claim 14, wherein the plurality of first emission areas displays a first color or a second color in accordance with phase change of the plurality of phase change material layers, the plurality of second emission areas displays only one of the first color and the second color, and the third emission area displays a color of light emitted by the organic light emitting layer.

16. The lighting device according to claim 12, wherein the plurality of phase change material layers and the plurality of third electrodes are disposed to have a one to one correspondence.

17. The lighting device according to claim 16, wherein the display area includes:
    a plurality of first emission areas in which the plurality of third electrodes and the plurality of phase change material layers are disposed; and
    a second emission area excluding the plurality of first emission areas.

18. The lighting device according to claim 17, wherein the plurality of first emission areas displays a first color or a second color in accordance with phase change of the plurality of phase change material layers and the second emission area displays a color of light emitted by the organic light emitting layer.

19. A lighting device, comprising:
    a substrate including a display area and a non-display area;
    a plurality of third electrodes on the substrate;
    at least one phase change material layer on the plurality of third electrodes;
    a second electrode on the at least one phase change material layer;
    an organic light emitting layer on the second electrode; and
    a first electrode on the organic light emitting layer.

20. The lighting device according to claim 19, wherein the at least one phase change material layer comprises a plurality of phase change material layers, each of the plurality of phase change material layers having an upper and a lower surface, and including a plurality of first emission at locations where the second electrode and one of the plurality of third electrodes are disposed on the upper and lower surfaces of one of the plurality of phase change material layers, and further including a plurality of second emission areas at locations where only the second electrode is disposed on the upper surface the plurality of phase change material layers.

* * * * *